(12) United States Patent
Lim et al.

(10) Patent No.: US 6,850,579 B2
(45) Date of Patent: Feb. 1, 2005

(54) MULTIPLIERLESS FINITE IMPULSE RESPONSE FILTER

(75) Inventors: In-Gi Lim, Taejon (KR); Ik-Soo Eo, Taejon (KR); Kyung-Soo Kim, Taejon (KR); Han-Jin Cho, Taejon (KR)

(73) Assignee: Electronics and Telecommunications Research Institute (KR)

( * ) Notice: Subject to any disclaimer, the term of this patent is extended or adjusted under 35 U.S.C. 154(b) by 709 days.

(21) Appl. No.: 09/753,258

(22) Filed: Dec. 29, 2000

(65) Prior Publication Data

US 2002/0075953 A1 Jun. 20, 2002

(30) Foreign Application Priority Data

Oct. 26, 2000 (KR) ........................................ 2000-63098

(51) Int. Cl.[7] .............................................. H03K 5/159
(52) U.S. Cl. ...................................... 375/350; 708/313
(58) Field of Search ................................ 375/143, 152, 375/350; 708/313, 314

(56) References Cited

U.S. PATENT DOCUMENTS 4,972,360 A  * 11/1990  Cukier et al. ............... 708/307
5,274,469 A  * 12/1993  Small et al. ................. 358/445
5,297,069 A  *  3/1994  Asato et al. ................. 708/319

OTHER PUBLICATIONS

Han et al., Pub. No.: US 2002/0145970 A1, Pub. Date: Oct. 10, 2002.*

* cited by examiner

Primary Examiner—Young T. Tse
(74) Attorney, Agent, or Firm—Blakely Sokoloff Taylor & Zafman (57) ABSTRACT

A finite impulse response filter of 1:4 interpolation with 108 taps for outputting filter output data of 8 bits with respect to filter input data of 4 bits includes four shifting and storing unit of 27 bits for unifying bits of filter input data of 4 bits, which is 2's complement to shift and store the bi-unified input data, first selection unit for selecting any one of the input data stored in the four shifting and storing unit of 27 bits, address generating unit for generating addresses of lookup tables corresponding to each of a plurality of filter coefficients groups, first to fourth lookup table groups for generating filter outputs of each filter coefficients group, four accumulating unit for shifting the filter outputs of the filter coefficients groups respectively outputted in parallel from the first to the fourth lookup table groups, and second selection unit for serially converting the outputs from each of the four accumulators in accordance with filter coefficients groups.

8 Claims, 8 Drawing Sheets

| 108TAP | 0 | 1 | ... | 22 | 23 | 24 | 25 | ... | 46 | 47 | 48 | 59 | 60 | 61 | ... | 82 | 83 | 84 | 85 | ... | 106 | 107 |
|---|---|---|---|---|---|---|---|---|---|---|---|---|---|---|---|---|---|---|---|---|---|---|
| | LUT_0 | | | | | LUT_1 | | | | | LUT_C | | | | | LUT_2 | | | | | LUT_3 | |

| LOOKUP TABLE GROUP 0 | 0 | 4 | 8 | 12 | 16 | 20 | 24 | 28 | 32 | 36 | 40 | 44 | 48 | 52 | 56 | 60 | 64 | 68 | 72 | 76 | 80 | 84 | 88 | 92 | 96 | 100 | 104 |
|---|---|---|---|---|---|---|---|---|---|---|---|---|---|---|---|---|---|---|---|---|---|---|---|---|---|---|---|
| | $2^5$LUT0_0 | | | | | | $2^5$LUT0_1 | | | | | | $2^2$LUT0_C | | | | $2^5$LUT0_2 | | | | | | $2^5$LUT0_3 | | | | |

| LOOKUP TABLE GROUP 1 | 1 | 5 | 9 | 13 | 17 | 21 | 25 | 29 | 33 | 37 | 41 | 45 | 49 | 53 | 57 | 61 | 65 | 69 | 73 | 77 | 81 | 85 | 89 | 93 | 97 | 101 | 105 |
|---|---|---|---|---|---|---|---|---|---|---|---|---|---|---|---|---|---|---|---|---|---|---|---|---|---|---|---|
| | $2^5$LUT1_0 | | | | | | $2^5$LUT1_1 | | | | | | $2^2$LUT1_C | | | | $2^5$LUT1_2 | | | | | | $2^5$LUT1_3 | | | | |

| LOOKUP TABLE GROUP 2 | 2 | 6 | 10 | 14 | 18 | 22 | 26 | 30 | 34 | 38 | 42 | 46 | 50 | 54 | 58 | 62 | 66 | 70 | 74 | 78 | 82 | 86 | 90 | 94 | 98 | 102 | 106 |
|---|---|---|---|---|---|---|---|---|---|---|---|---|---|---|---|---|---|---|---|---|---|---|---|---|---|---|---|
| | $2^5$LUT2_0 | | | | | | $2^5$LUT2_1 | | | | | | $2^2$LUT2_C | | | | $2^5$LUT2_2 | | | | | | $2^5$LUT2_3 | | | | |

| LOOKUP TABLE GROUP 3 | 3 | 7 | 11 | 15 | 19 | 23 | 27 | 31 | 35 | 39 | 43 | 47 | 51 | 55 | 59 | 63 | 67 | 71 | 75 | 79 | 83 | 87 | 91 | 95 | 99 | 103 | 107 |
|---|---|---|---|---|---|---|---|---|---|---|---|---|---|---|---|---|---|---|---|---|---|---|---|---|---|---|---|
| | $2^5$LUT3_0 | | | | | | $2^5$LUT3_1 | | | | | | $2^2$LUT3_C | | | | $2^5$LUT3_2 | | | | | | $2^5$LUT3_3 | | | | |

| OUTPUT FROM THE INPUT SHIFT REGISTER | 6BIT | 6BIT | 3BIT | 6BIT | 6BIT |
|---|---|---|---|---|---|
| | A[26:21] | A[20:15] | A[14:12] | A[11:6] | A[5:0] |

MULTIPLIERLESS FINITE IMPULSE RESPONSE FILTER

FIELD OF THE INVENTION

The present invention relates to a digital filter, and in particular, a multiplierless finite impulse response filter (hereinafter, referred to as "an FIR").

DESCRIPTION OF THE PRIOR ART

As widely known, a 1:4 interpolation FIR with 108 taps has been standardized in case of the FIR filter for pulse forming within the International Mobile Telecommunication (IMT)-2000 synchronous modulator. The 1:4 interpolation FIR filter of about 108 taps is also required to satisfy the filter standard in case of the IMT-2000 of an asynchronous type. Here, multi-bits of 2's complemented data are inputted as a filter. To realize the FIR filter with such input data, a multiplier of a large capacity of hardware needs to be employed.

To be specific, an exemplary system, to which the FIR filter is applicable, is a terminal modulator of the IMT-2000 synchronous type. A pulse forming interpolation filtering is required to suppress inter-symbol interference at the most rear end of the modulator in case of a modulator for digital mobile telecommunication. Particularly in case of a synchronous terminal modulator for use of the IMT-2000, one hit output of four channels is multiplied by a gain and added by two channels each within in a single chip. The result undergoes an orthogonal complex quadrature phase shift keying (OCQPSK) modulation, thereby including two FIR filters of n-bit input data.

Figure 1:
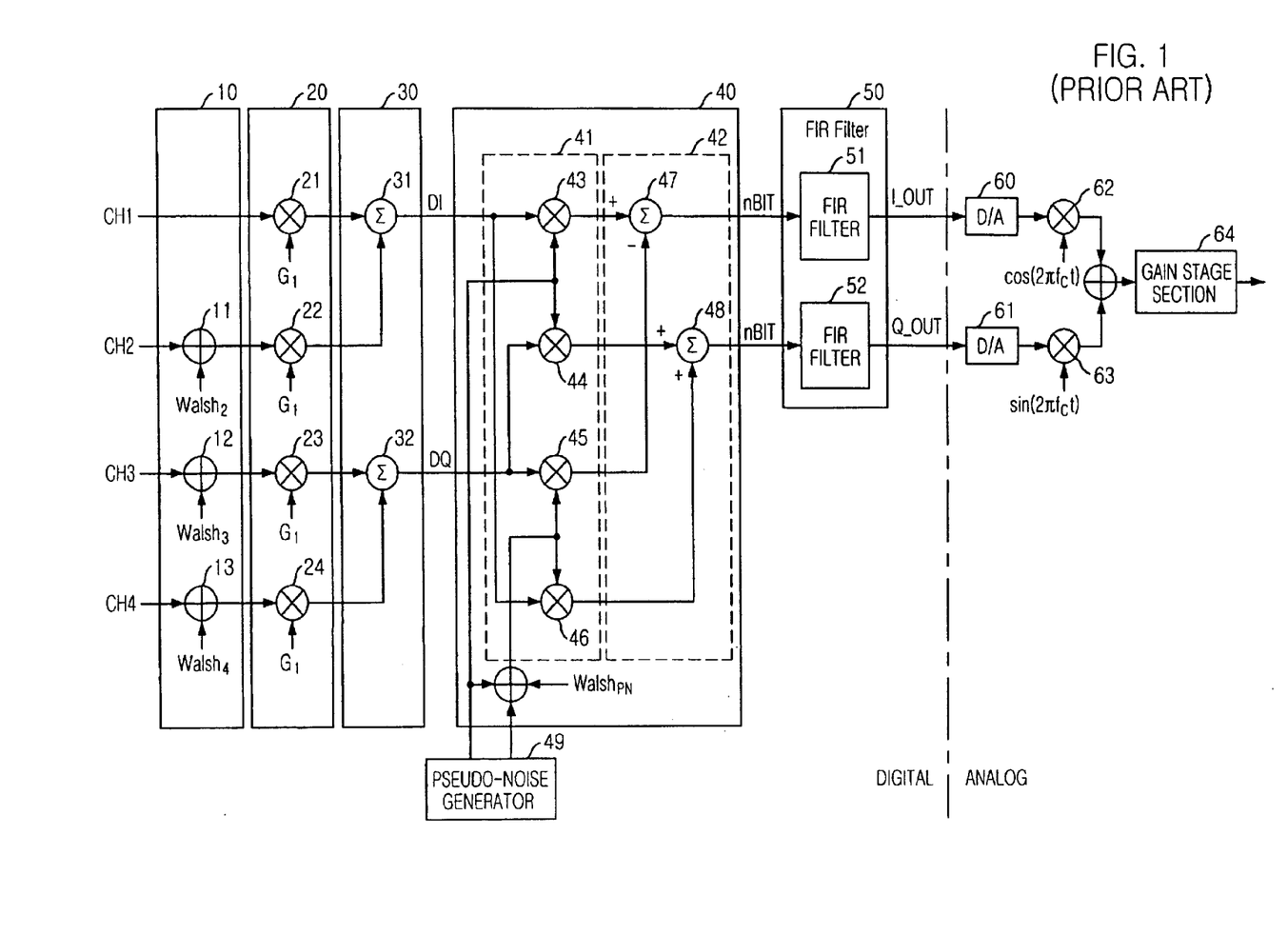
FIG. 1 is a block diagram showing a construction of an OCQPSK modulator comprising an OCQPSK modulating block and an FIR filter block as set forth in the specification of an IMT-2000 synchronous terminal.

FIG. 1 is a diagram illustrating a construction of an OCQPSK modulator comprising an OCQPSK modulation block and a FIR filter block. The OCQPSK modulator within the modulator comprises: a Walsh covering section 10 for distinguishing four channels; a gain stage section 20 for controlling gain of each channel; a channel adder 30; an OCQPSK modulating section 40; an FIR filter section 50 for pulse forming, etc.

Referring to FIG. 1, each of one-bit input data into four channels (CH1, CH2, CH3, CH4) is Walsh-covered at the Walsh covering section 10 by means of the Walsh orthogonal codes Walsh2, Walsh3, Walsh4 for classification of channels. Each of the one-bit data inputted to four channels then passes through the gain stage section 20 for multiplying the gains G1, G2, G3, G4 of each channel through the multipliers 21, 22, 23, 24 for gain control of each channel. The n-bit data outputted from the gain stage section 20 are generated to be two orthogonal data DI, DQ after being added by two channels each by means of adders 31, 32 of the channel adder 30. The generated two orthogonal data DI, DQ are modulated by the OCQPSK modulator 40. The OCQPSK modulating section 40 comprises a PN spreader 41 using a pseudo-noise (PN) sequence generated by the pseudo-noise generator (PNG) 49, and a complex multiplier 42 for complex multiplication based on the OCQPSK modulating method. The data outputted from the OCQPSK modulating section 40 are n number of bits, and inputted to two FIR filters 51, 52 of n-bit data for pulse forming so as to undergo an FIR filtering. The output data of these two FIR filters 51, 52 are inputted to the digital-analog (D/A) converter 60, 61 of an analog chip to be converted to analog data, and are modulated by the multipliers 62, 63. Gains are multiplied by the gain stage section 64 for final output.

In short, the two FIR filters 51, 52 having n number of bits in such a modulator are realized by using a multiplier, thereby posing a problem of increasing the capacity of hardware.

The following is a brief description of the conventional art and the present invention under an assumption that the number of bits of coefficients to be 12 bits, the number of bits inputted to the filter in 2's complemented data to be 4 bits, and the number of bits outputted from the filter to be 8 bits as a standard size of the 1:4 interpolation FIR filter with 108 taps as set forth in the IS-2000 specification, which is an IMT-2000 synchronous standard.

Under the conventional art, an FIR filter having multi-bit inputs as described above was realized by a transversal FIR filter.

Figure 2:
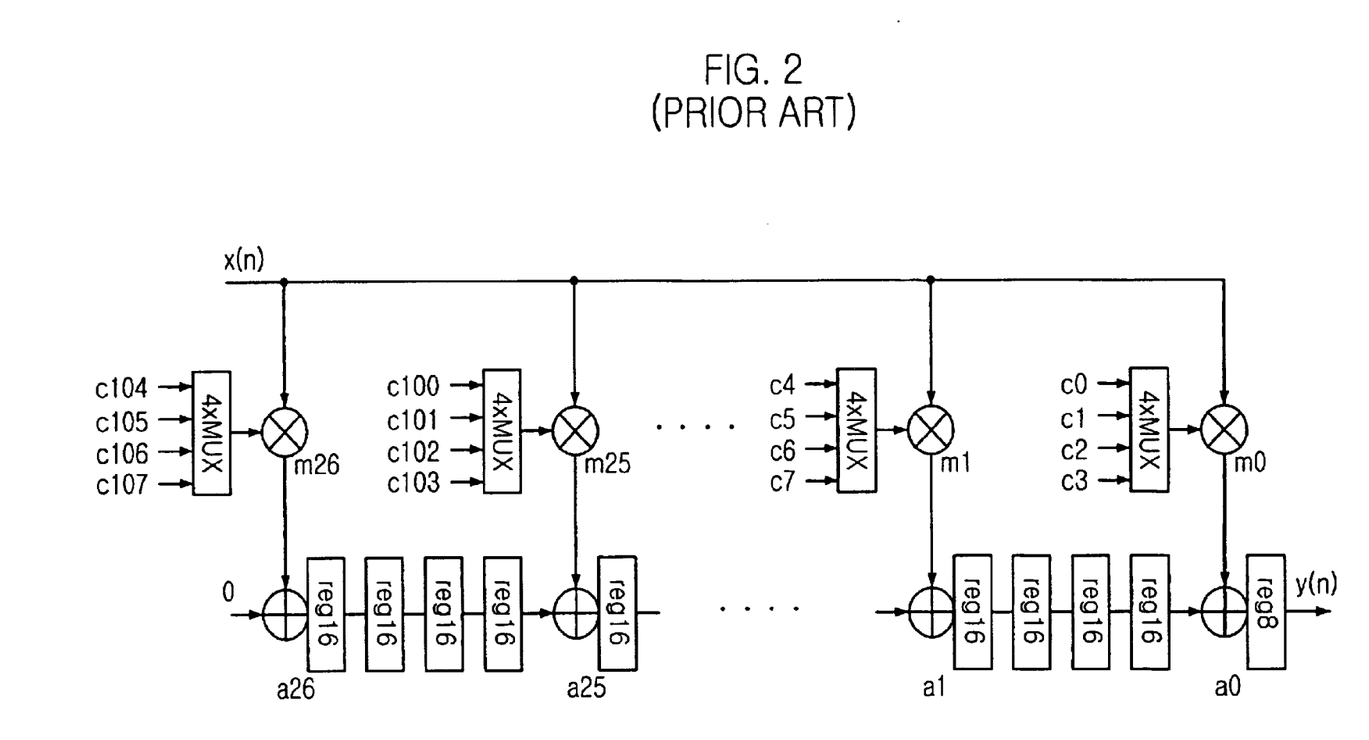
FIG. 2 is a diagram showing a construction of a 1:4 interpolation transverse FIR filter with 108 taps according to the conventional art.

FIG. 2 is a block diagram showing a 1:4 interpolation transversal FIR filter of the 108 taps according to the conventional art.

The transversal FIR filter shown in FIG. 2 is the most basic and the traditional FIR filter method. The pulse forming FIR filter according to the above assumption comprises 27 number of 12×4 multipliers (m26 through m0), 27 number of 16-bit adders (a26 through a0), 104 number of 16-bit registers (reg16), and one 8-bit register (reg8), as shown in FIG. 2.

The transversal FIR filter constructed above has a single structure. Therefore, only a single filter computation can be performed. Also, employing a multiplier having hardware of a large capacity necessitates hardware of a great size of about 27,000 gates.

SUMMARY OF THE INVENTION

It is, therefore, an object of the present invention to provide an FIR filter for processing an FIR filter computation by using a lookup table mode appropriate to computation of a high speed without using a multiplier having hardware of a large capacity.

To achieve the above and other objects, there is provided a 1:4 interpolation finite impulse response filter with 108 taps for outputting 8-bit filter output data with respect to the 4-bit filter input data, the filter comprising: four number of 27-bit shift and storing means for unifying the bit of the 4-bit filter input data, which is 2's complemented data; first selection means for selecting one of the input data stored in the four number of 27-bit shift and the storing means in response to the first clock signal and the second clock signal; address generating means for generating an address of a lookup table corresponding to each of a plurality of filter coefficient groups in response to the input data selected by the first selection means; first to fourth lookup table groups; four accumulating means for shifting a filter output of the filter coefficient groups outputted in parallel respectively from the first to the fourth lookup table groups, and estimating as much as the coefficient bit numbers; and a second selection means for serially converting the outputs from each of the four accumulating means in accordance with each filter coefficient group.

The finite impulse response filter according to the present invention further comprises a shift register and selector for unifying the bit of multi-bit filter input data, shift-storing the unified input data in response to a plurality of clock data, and outputting the same in order; address generating means for generating addresses of lookup tables corresponding to each of a plurality of filter coefficient groups in response to the output from the shift register and selector; a plurality of lookup table groups for generating the filter output of each filter coefficient group in response to the address generated by the address generating means; a plurality of accumulating means for shifting the filter output from the filter coefficient groups, and estimating as much as the coefficient bit numbers; and group selection means for serially converting the output from each of the accumulating means in accordance with each filter coefficient group.

BRIEF DESCRIPTION OF THE DRAWINGS

The above and other objects, features and advantages of the present invention will become more apparent from the following detailed description when taken in conjunction with the accompanying drawings, in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

To summarize an embodiment of the present invention, the embodiment suggests a 1:4 interpolation FIR filter of multi-bit input data dispensing with a multiplier. For that purpose, m-bit input data of 2's complement are converted into m number of one bit. Also, a plurality of one bit input data of the 1:4 interpolation FIR filter are simultaneously computed by a single independent filter without increasing the operational frequency wave, and the plurality of one bit input data of the 1:4 interpolation FIR filter are computed in accordance with each coefficients group, thereby ultimately outputting 4 filter output values. The lookup tables are realized in a size much smaller than the conventional lookup table capacity due to the symmetry of the filter coefficients as well as the symmetry within the lookup tables.

Figure 3:
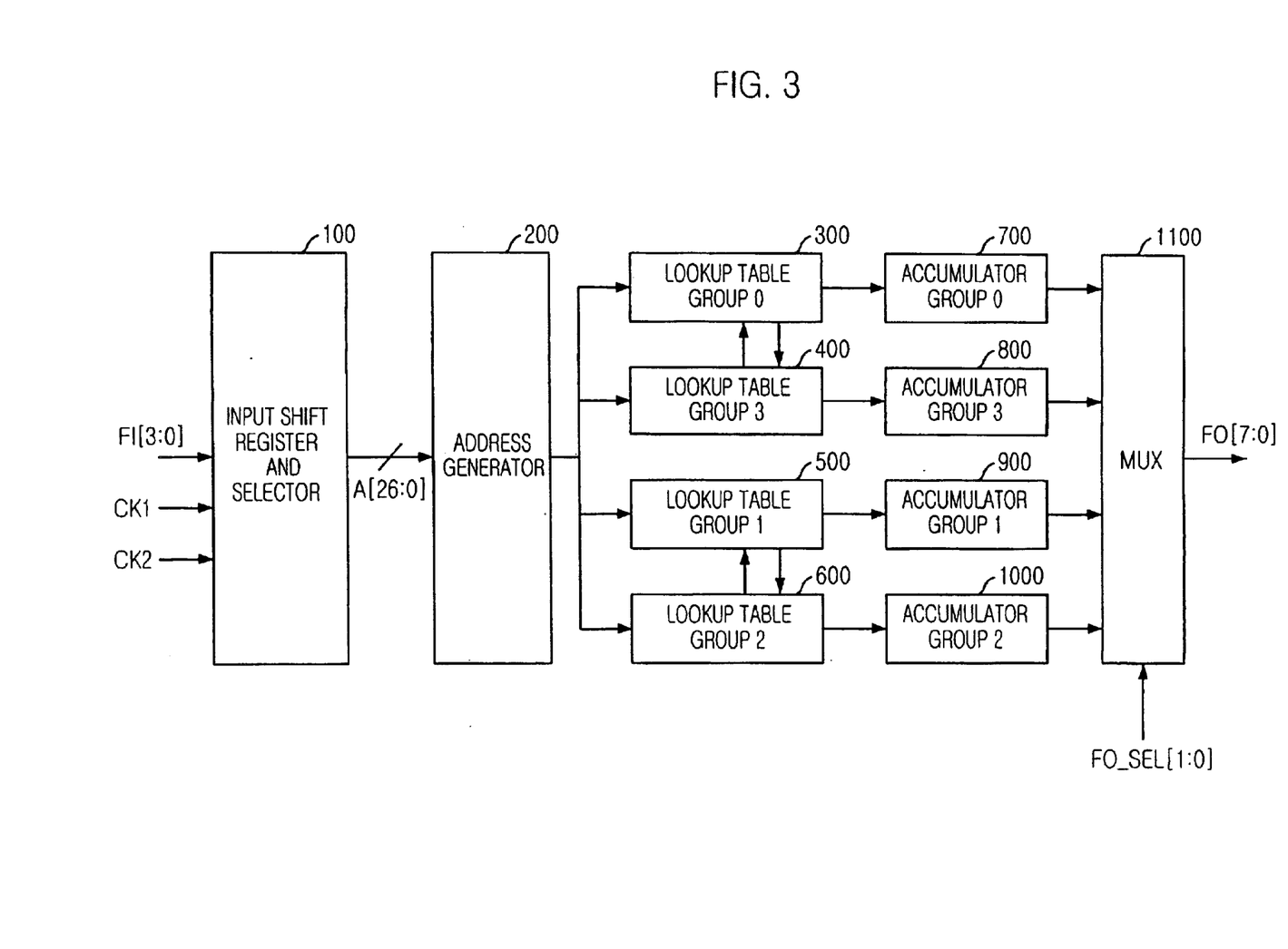
FIG. 3 is a block diagram showing a construction of a 1:4 interpolation FIR filter with 108 taps dispensing with a multiplier according to an embodiment of the present invention.

FIG. 3 is a block diagram showing a construction or a 1:4 interpolation FIR filter with 108 taps dispensing with a multiplier according to an embodiment of the present invention.

Referring to FIG. 3, the FIR filter according to the present invention comprises: an input shift register and a selector 100 for unifying the data of 4-bit, which is a 2's complement, inputted to the filter FI[3:0], shifting and storing the unified data in response to a clock signal ck1, and selecting anyone of the stored input data in response to clock data ck1, ck2; an address generator 200 for generating addresses in conformity with the lookup tables of each coefficients group in response to the selected input data A[26:0] outputted from the input shift register and the selector 100; lookup table group0 300, lookup table group3 400, lookup table group1 500 and lookup table group2 600 for receiving an address corresponding to the group outputted from the address generator 200, generating an output of the filter corresponding to the address in accordance with the groups, and computing the generated output of the filter; accumulator group0 700, accumulator group3 800, accumulator group1 900, and accumulator group2 1000 for shifting right and estimating the results outputted from each coefficients group as much as the number of bits of input data; and a 4×1 multiplexer (hereinafter, referred to as "a MUX") 1100 for serially outputting (F0[7:0]) outputs from each accumulator group in response to a control signal F0_SEL[1:0].

The following is a description of the construction of coefficients address division and lookup tables.

Figure 4:
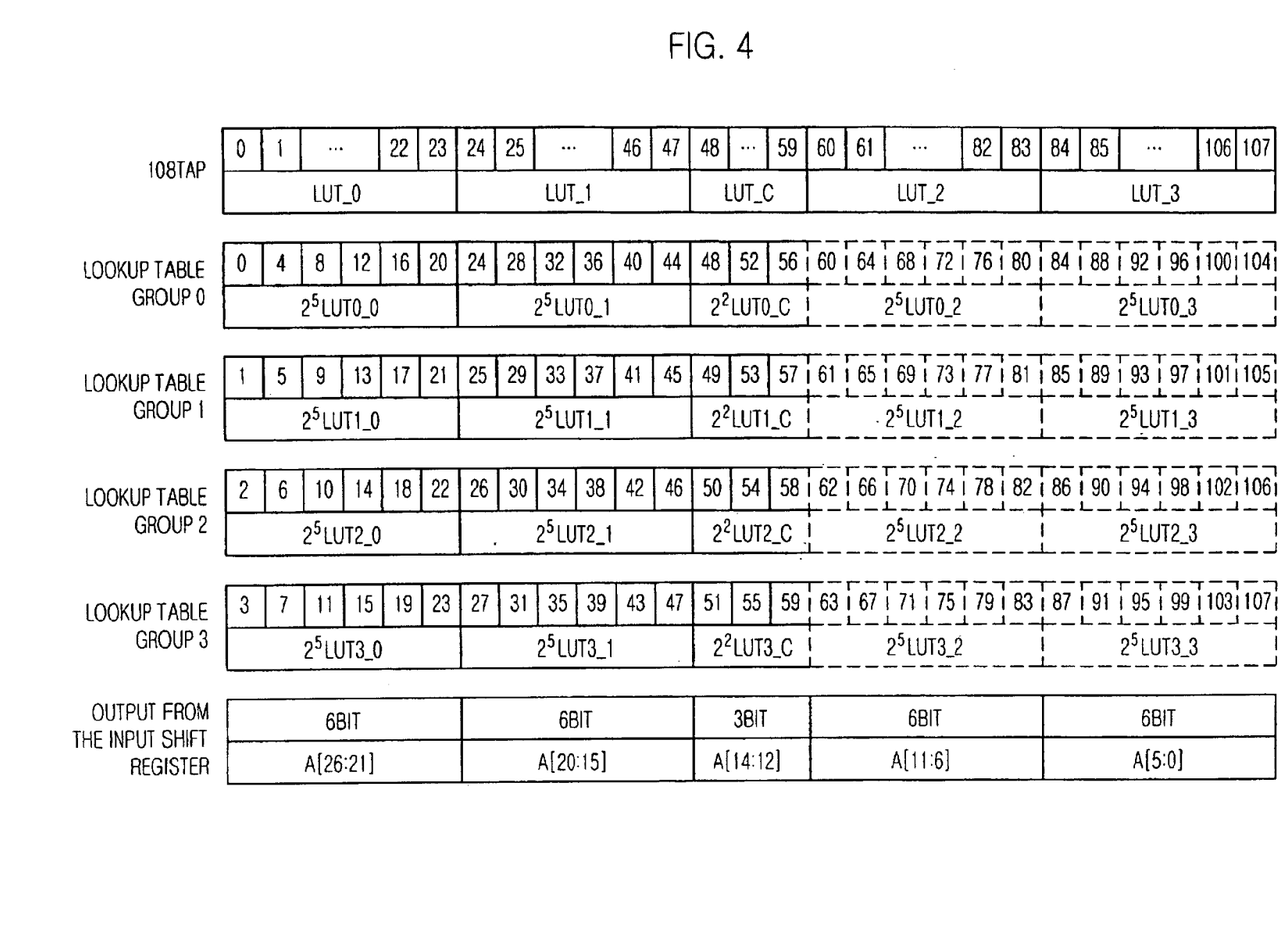
FIG. 4 is a conceptual diagram showing constructions of exemplary coefficients address division and lookup table groups according to the present invention.

FIG. 4 is a conceptual diagram showing constructions of exemplary coefficients address division and lookup table groups according to the present invention. As assumed above, FIG. 4 illustrates a case of a 1:4 interpolation filter with 108 taps.

Referring to FIG. 4, the coefficients with 108 taps are divided into five parts as shown in Formula 1 below in order to utilize the symmetry of 0–53 and 54–107 of the filter coefficients and to reduce the size of the lookup tables.

Formula 1

LUT_0={C0, C1, C2, C3, . . . , C22, C23} (24 coefficients)

LUT_1={C24, C25, C26, . . . , C46, C47} (24 coefficients)

LUT_C={C48, C49, C50, . . . , C58, C59} (12 coefficients)

LUT_2={C60, C61, C62, . . . , C82, C83} (24 coefficients)

LUT_3={C84, C85, C86, . . . , C106, C107} (24 coefficients)

In the above Formula 1, LUT_0 and LUT_3, LUT_1 and LUT_2 have the same coefficients due to symmetry of left and right sides. The 12 coefficients of LUT_C become 3 when divided into 4. Thus, circuits can be reduced by not utilizing the symmetry of left and right sides of the coefficients. Accordingly, the five parts of the coefficients are divided into the filter coefficients groups as follows by the 1:4 interpolation filter: LUT_0 into the filter coefficients group of LUT0_0-LUT3_0; LUT_1 into the filter coefficients group of LUT0_1-LUT3_1; LUT_C into the filter coefficients group of LUT0_C-LUT3_C; LUT_2 into the filter coefficients group of LUT0_2-LUT3_2; and LUT_3 into the filter coefficients group of LUT0_3-LUT3_3, respectively. However, the number of lookup tables are reduced to be a half by avoiding realization of the lookup tables for all of the filter coefficients groups, i.e., by not realizing the filter coefficients groups of LUT0_2-LUT3_2 of the LUT_2 part and the coefficients groups of LUT0_3-LUT3_3 of the LUT_3 part but converting the inputted addresses and accessing the LUT_0 part and the LUT_1 part twice due to the symmetry of the coefficients of left and right sides.

The following is a description of the symmetry within the lookup tables made in conjunction with the case of the filter coefficient LUT0_0.

The LUT0_0 consists of 6 coefficients: C0, C4, C8, C12, C16 and C20. If taking +Cn when '0' is inputted and taking −Cn when '1' is inputted, the lookup table values become as follows depending on the state of the 64 kinds of 6-bit input data.

TABLE 1

| Address | Output Values of the Lookup Tables |
|---------|-----------------------------------|
| 000000  | +C0 +C4 +C8 +C12 +C16 +C20        |
| 000001  | +C0 +C4 +C8 +C12 +C16 −C20        |
| .       | .                                  |
| .       | .                                  |
| .       | .                                  |
| 111110  | −C0 −C4 −C8 −C12 −C16 +C20        |
| 111111  | −C0 −C4 −C8 −C12 −C16 −C20        |

In the above Table 1, the first value and the last value have opposite symbols but the same amount of value. In other words, of the 64 lookup table values, the values of the first 32 ones are symmetrical with those of the last 32 ones with opposite symbols. Accordingly, the number of the lookup table of the LUT0_0 is realized not to be $2^6$ but to be $2^5$. The number of the lookup tables can be reduced to be half by outputting the lookup table value per se when the most significant bit of the input bit is '0', while outputting the lookup table value by reversing the symbol when the most significant bit of the input bit is '1'.

Meanwhile, the output data of the input shift register are 27 bits, and are signified as A[26:0]. A[0] is the bit of the first input signal, while A[26] is the bit of the last input signal. Here, A[26:21] among the 27 bits of the A[26:0] is inputted to the LUT_0 part; A[20:15] to the LUT_1 part; and A[14:12] to the LUT_C part. Also, A[11:6] is inputted to the LUT_1 part in lieu of the LUT_2 dues to a changed order to A[6:11] due to the symmetry of the coefficients. Likewise, A[5:0] is inputted to the LUT_0 part in lieu of the LUT_3 due to a changed order A[0:5].

Figure 5:
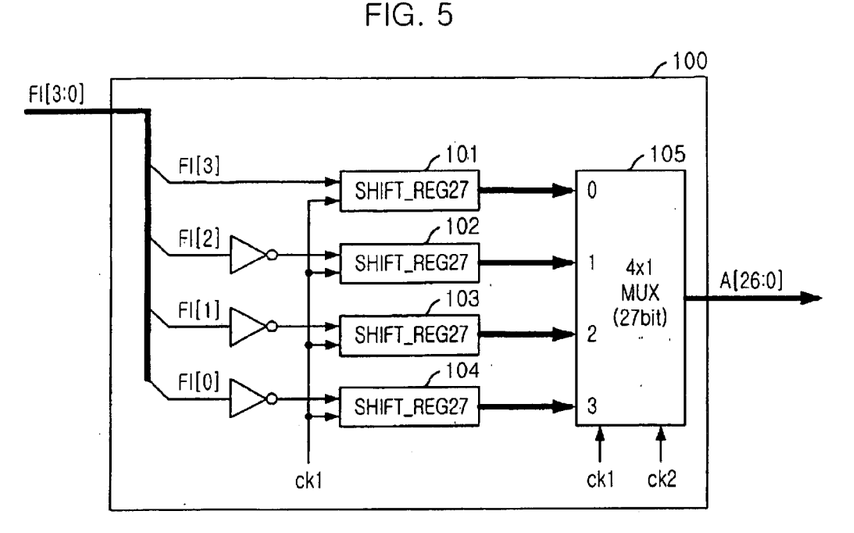
FIG. 5 is a block diagram showing inside of a shift register and selector in FIG. 3 according to an embodiment of the present invention.

FIG. 5 is a block diagram showing inside of a shift register and selector 100 in FIG. 3 according to an embodiment of the present invention.

Referring to FIG. 5, the shift register and selector 100 receives FI[3:0], which are 2's complemented 4-bit data inputted to the filter. The 4-bit filter input data FI[3:0] have 16 different cases with a maximum being '0111(+7)' and a minimum being '1000(−8)'. Here, the input to the filter takes a form of antipodal bits, in which '0' is converted to '+1' and '1' to '−1'. Hence, the most significant hit FI[3] should be inputted per se, while FI[2], FI[1], FI[0] should be reversed. Accordingly the maximum value of the filter input '0111' is converted '0000', thereby having a value of '+15'. The minimum value of the filter input '1000' is converted to '1111', thereby having a value of '−15'. The four single bit inputs converted as above are inputted to and stored in the respective shift registers SHIF_REG27 in response to the clock signal ck1. The values stored in the shift register are selected in order by a 4×1 multiplexer 105 controlled by two clock data ck1, ck2 so as to be outputted as A[26:0].

Figure 6:
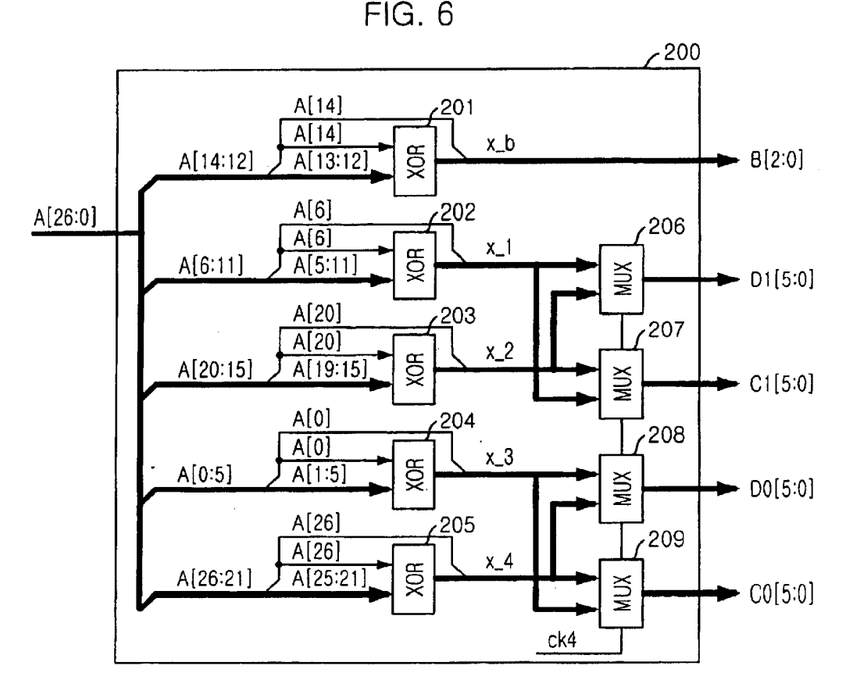
FIG. 6 is a block diagram showing inside of an address generator in FIG. 3 according to an embodiment of the present invention.

FIG. 6 is a block diagram showing inside of an address generator 200 in FIG. 3 according to an embodiment of the present invention.

Referring to FIG. 6, the address generator 200 comprises four MUX 206 to 209 for accessing the LUT_1 and the LUT_0 twice in lieu of the LUT_2 and the LUT_3 that have been omitted by using the symmetry of filter coefficients, and exclusive OR gates 201 to 205 for an exclusive OR with the most significant bit of the address inputted to access the address in the omitted lookup table due to the symmetry within the lookup table.

The output B[2:0] of the address generator 200 in FIG. 6 is an address for the LUT0_C-LUT3_C that is expressed as follows.

B[2]=A[14], B[1]=A[14]⊕A[13], B[0]=A[14]⊕A[12]

C0[5:0] is an address for the LUT0_0 and the LUT1_0. When the clock is signal ck4 is '0', C0[5] is outputted as follows.

C0[5]=A[26], C0[4]=A[26]⊕A[25], C0[3]=A[26]⊕A[24], C0[2]=A[26]⊕A[23], C0[1]=A[26]⊕A[22], C0[0]=A[26]⊕A[21].

If the clock signal ck4 is '1', C0[5] is outputted as follows.

C0[5]=A[0], C0[4]=A[0]⊕A[1], C0[3]=A[0]⊕A[2], C0[2]=A[0]⊕A[3], C0[1]=A[0]⊕A[4], C0[0]=A[0]⊕A[5].

D0[5:0], C1[5:0] and D1[5:0] can be generated in the same manner.

Figure 7:
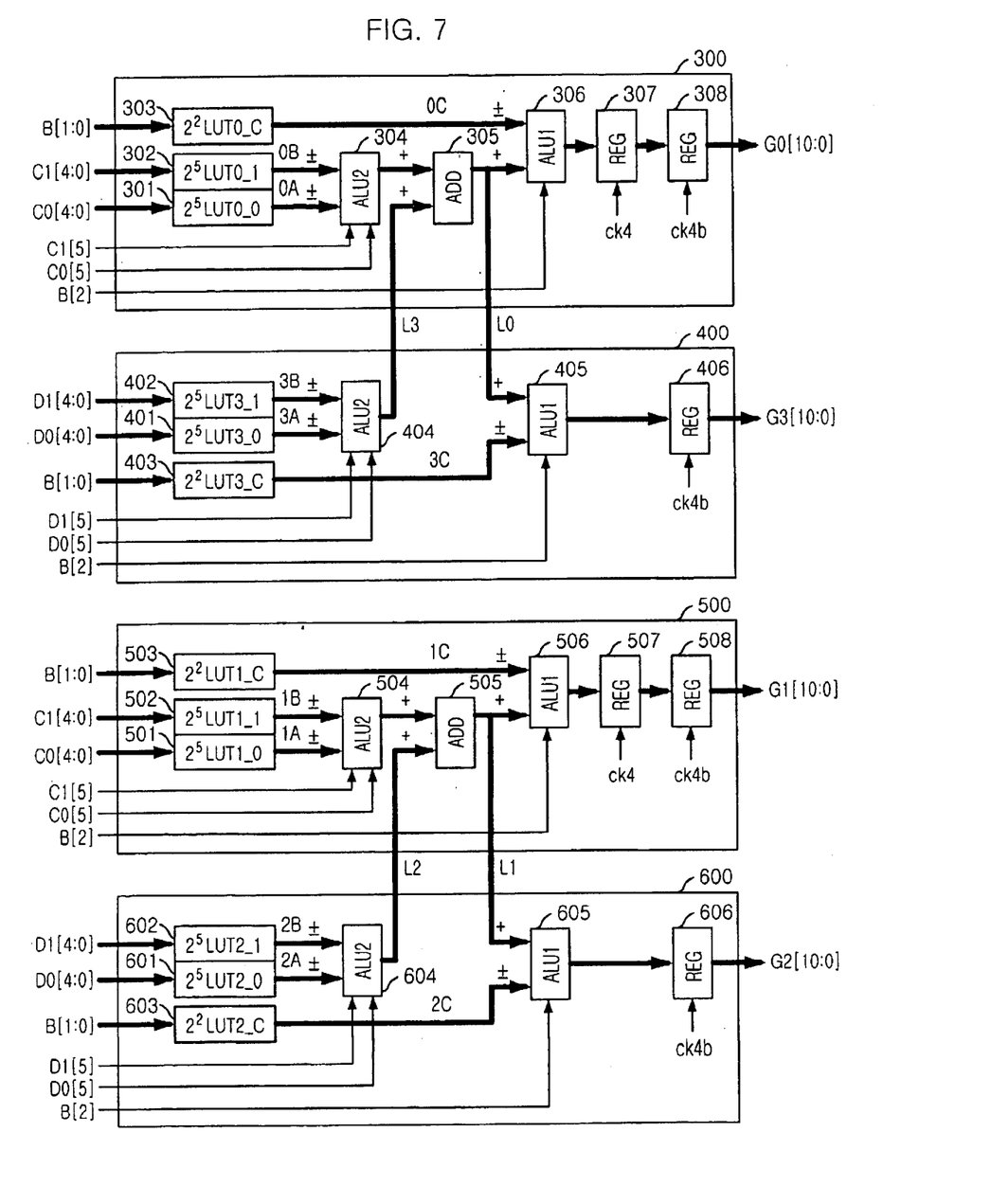
FIG. 7 is a block diagram showing insides of lookup table group0, lookup table group3, lookup table group1, and a lookup table group2 according to an embodiment of the present invention.

FIG. 7 is a block diagram showing insides of lookup table group0 300, lookup table group3 400, lookup table group1 500, and a lookup table group2 600 according to an embodiment of the present invention.

Referring to FIG. 7, the lookup table group0 300 is a block for generating the filter result of the filter coefficients group0 by computation with the lookup table. The following is a description of an operation of the lookup table group0.

C0[4:0] is first inputted to the LUT0_0 301 to output an 0A, which is one of the 32 lookup table values. C1[4:0] is inputted to the LUT0_1 302 to output an 0B, which is one of the 32 lookup table values. B[1:0] is inputted to the LUT0_0 303 to output an 0C, which is one of the 4 lookup table values. A computation circuit section ALU2 304, which is a computation circuit for compensating the lookup table value omitted for symmetry of the lookup table, performs the following operation as expressed by Formula 2 below.

Formula 2

If C0[5]='0', and C1[5]='0', ALU2 output=0A+0B.
If C0[5]='0', and C1[5]='1', ALU2 output=0A−0B.
If C0[5]='1', and C1[5]='0', ALU2 output=−0A+0B.
If C0[5]='1', and C1[5]='1', ALU2 output=−0A−0B.

The LUT3_0 401 and the LUT3_1 402 of the lookup table group3 400, which has a symmetrical lookup table value, are respectively addressed to D0[4:0] and D1[4:0] for calculation of the LUT0_2 and the LUT0_3 in FIG. 4 that have been removed by using the symmetry of coefficients. A computation circuit section ALU2 404 performs the computation as expressed in the Formula 2 under a control by the D0[5] and D1[5] to generate L3. The generated L3 and the existing output from the computation circuit section ALU2 304 are summed by an adding section (ADD) 305 to generated L0. A computation circuit section ALU1 306 outputs 'L0+0C' if B[2]='0', and 'L0−0C' if B[2]='1' according to B[2]. A register 307 connected to an output terminal of the computation circuit section 306 is a register for storing G0[10:0], which is an output of the lookup table groups 300, in response to a positive edge of the clock signal ck4, and buffering the output value of the lookup table group0, which is accessed twice due to the symmetry of coefficients. Another register 308 buffers the value stored in the register 307 in response to a negative edge of the clock signal ck4, and outputs the output signal G0[10:0] of the filter.

Meanwhile, the lookup table group3 400, the lookup table group1 500, and the lookup table group2 600 also generate the respective outputs of the filter G3[10:0], G1[10:0], G2[10:0] in the same operational manner as the lookup table group0 300 described above.

Figure 8:
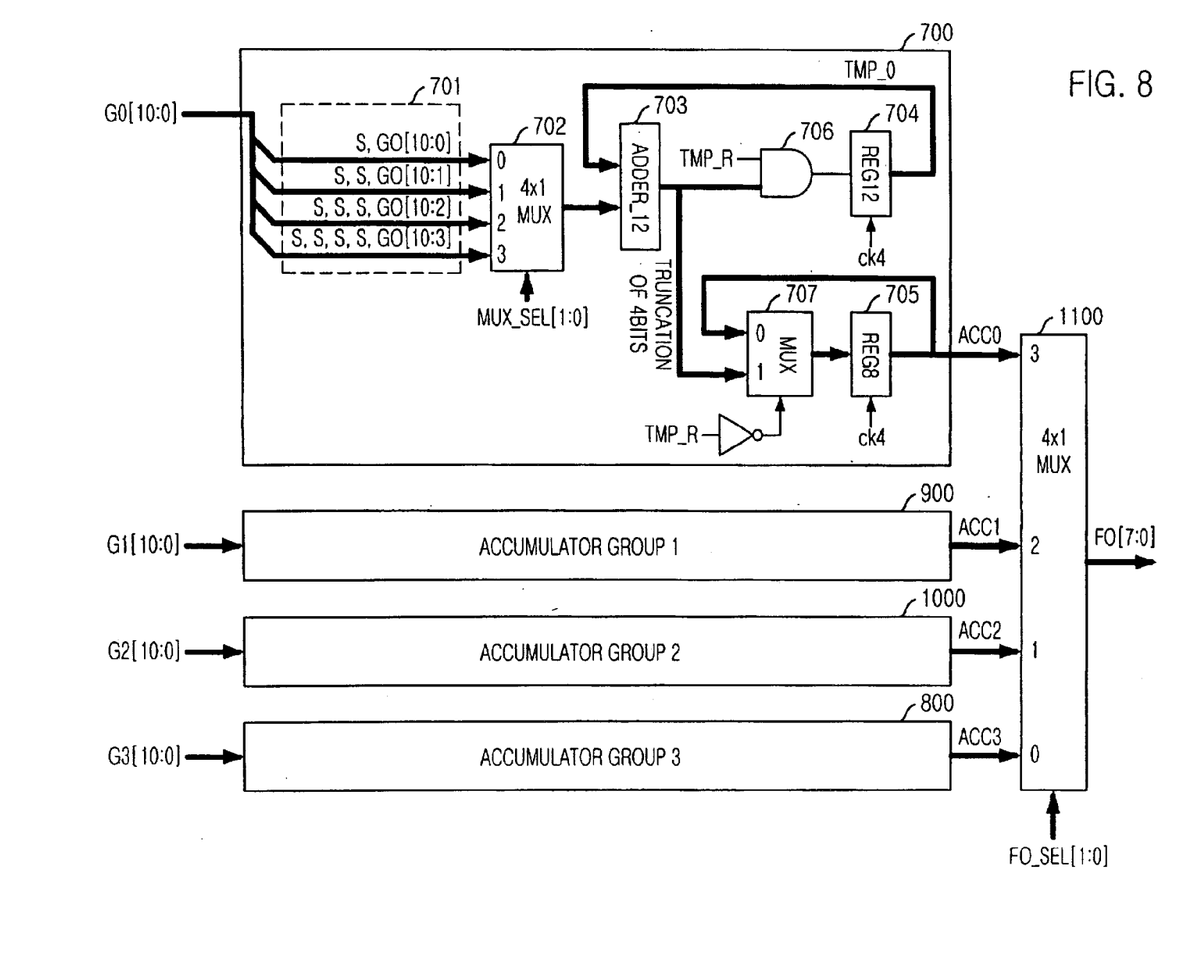
FIG. 8 is a block diagram showing insides of accumulator group0, accumulator group1, accumulator group2, and accumulator group3 in FIG. 3 according to an embodiment of the present invention.

FIG. 8 is a block diagram showing insides of accumulator group0 700, accumulator group1 900, accumulator group2 1000, and accumulator group3 800 in FIG. 3 according to an embodiment of the present invention. An inside block of the accumulator group0 700 only was specifically illustrated because the inside blocks of all the accumulator groups are the same.

Referring to FIG. 8, the accumulator group0 700 includes a shift and sign extension section 701 for sign-extending the most significant bit G0[10] among the input G0[10:0] to a sign value (identified as 'S' in FIG. 8). The shift and sign extension section 701 is for the purpose of providing a weight value of the filter output to be processed when the filter input data of 4 bits are converted to a single bit. For a filter input FI[3], S, G0[10:0] is generated. Here, extending one sign value to the most significant bit is to prevent an overflow generated from an adder ADDER_12 703 at the rear end thereof. For a filter input FI[2], one bit is shifted right to have a ½ weight value over the FI[3] for generating S, S, G0[10:1]. For a filter input FI[1], S, S, S, G0[10:2] are generated, while S, S, S, S, G0[10:3] are generated for FI[0], respectively.

In FIG. 8, the register REG12 704 operating in response to the adder 703 and the clock signal ck4 is to form an accumulator, while the OR gate receiving an output of the adder 703 and a control signal TMP_R is to reset the register 704 in response to the control signal TMP_R. A 2×1 MUX 707 and a register REG8 705 are to store the value accumulated through repetition of four times. The less 4 bits are truncated to be 8 bits, which is an output bit number of the filter.

Figure 9:
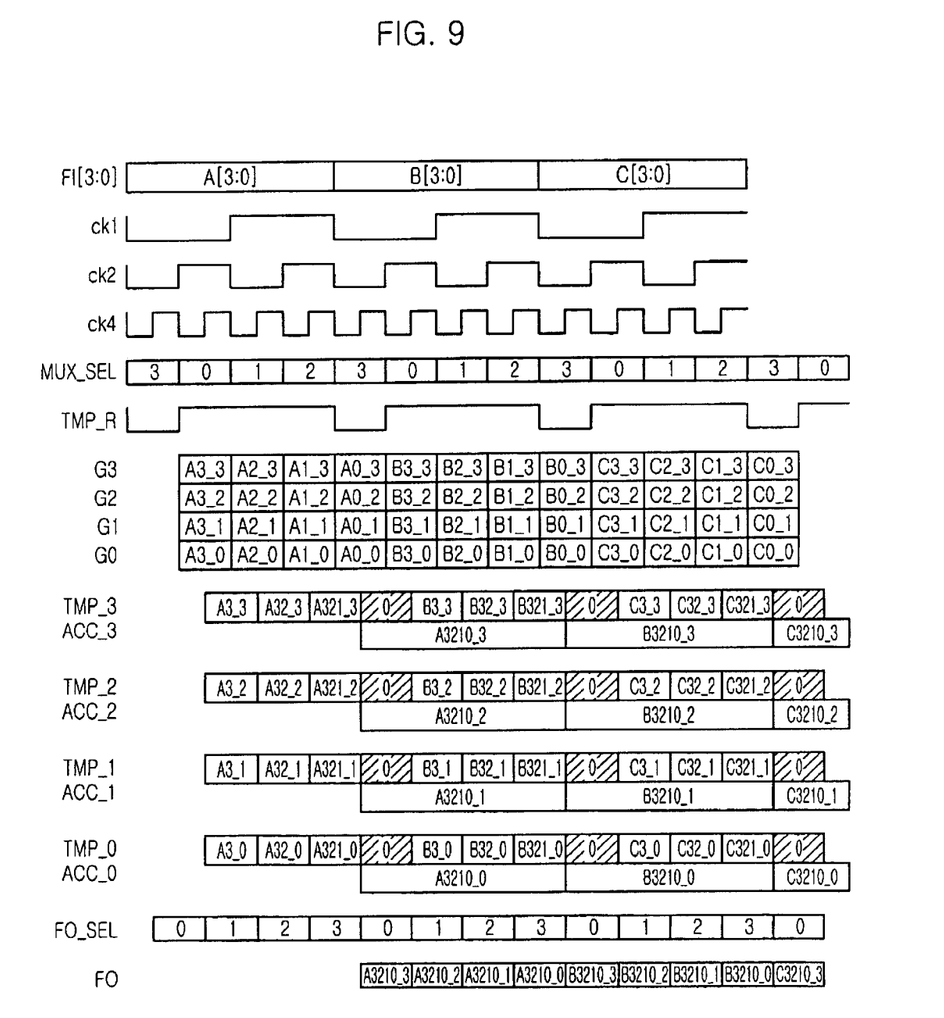
FIG. 9 is a diagram showing the timing of clock data and major data used in the FIR filter according to an embodiment of the present invention.

FIG. 9 is a diagram showing the timing of clock data and major data used in the FIR filter according to an embodiment of the present invention.

The estimating method and timing according to the present invention will now be described with reference to FIG. 9.

The output TMP_0 signal of the register 704 becomes A3_0[10:0], which is an output value of the A[3] coefficients group0 when MUX_SEL='00'. When MUX_SEL='01', an added value of A3_0[10:0] and A2_0[10:1], which is a shift-right value of A2_0 that is an output value of A[2], becomes TMP_0. When MUX_SEL='10', the adder 703 stores an added value A3_0[10:0]+A2_0[10:1] and A1_0[10:2], which is a two shift-right value of A1_0 that is an output value of A[1], in the register 704. As the last step, when MUX_SEL='11', the adder 703 adds 'A3_0[10:0]+A2_0[10:1]+A1[10:2]' and A0_0[10:3], which is a three shift-right value of A0_0 that is an output value of A[0], and stores 'A3_0[10:0]+A2_0[10:1]+A1[10:2]+A0[10:3]' as an ultimate filter output corresponding to the coefficients group0 of the A[3:0] filter input in the register 705 so as to be outputted as ACC0. At this stage, the register 704 is reset by TMP_R and the OR gate 706.

A filter output value ACC1 is generated by the accumulator group1 900 with respect to the coefficients group 1 of 4-bit filter input data in the same manner as described above. A filter output value ACC2 is generated by the accumulator group2 1000 for the coefficients group 2 with respect to the coefficients group 2 of 4-bit filter input data. A filter output value ACC3 is generated by the accumulator group3 800 for the coefficients group 3 with respect to the coefficients group 3 of 4-bit filter input data.

ACC0 through ACC3 generated in the above manner are outputted from the 4×1 MU 1100 by a control signal F0_SEL[1:0] in the order of ACC3, ACC2, ACC1 and ACC0 so as to generate F0[7:0], which is the ultimate filter output of the present invention.

The above description is merely based on one embodiment of the present invention under an assumption that the filter input data are 4 bits and the filter output data are 8 bits in the 1:4 interpolation FIR filter with 108 taps. The present invention can be extended to the construction described below if generalizing the number of taps to be T, the number of bits of the coefficients to be C, the filter input data are X bits, and the filter output data are Y bits in the in an 1:N interpolation FIR filter of T taps.

If generalizing the present invention to the above, the filter input data in FIG. 5 becomes FI[X-1:0], and all of FI[X-2:0] are inverted except FI[X-1]. Also, the number of shift registers becomes X, and its length becomes T/N. The MUX 105 should multiplex the X number of input data. The address generator 200 is determined depending on the divided number and size of the lookup tables. Appropriate exclusive OR gate and MUX are used to utilize the symmetry of the filter coefficients as well as the symmetry within the lookup tables. Here, it as preferable to select a construction of minimizing the size of the lookup tables and the added computation circuits.

The lookup table blocks of each coefficients group in FIG. 7 will be N number. It is advantageous to basically use the coefficients of T/2 alone by evening the T number of taps and using the symmetry of left and right sides of the coefficients. However, it may be also advantageous for use of a circuit not to utilize the symmetry of coefficients when the divided parts are not divided by N, as described with reference to the embodiment of the present invention.

The accumulator blocks of each coefficient group will be N number in FIG. 8. The times of adding by the accumulators will be X, which is a bit number of input data. The MUX 1100 selects the N number of accumulation output in order so as to be outputted as F0[Y-1:0].

The present invention constructed above realized a filter computation of not increasing an operational frequency wave with an FIR filter by unifying multi-bit filter input data in a 2's complemented form into a single bit filter input data so as not to use a multiplier as well as by effectively utilizing symmetry within the lookup tables, thereby minimizing the size of the entire lookup tables.

About 27,000 gates are required to lay out an FIR filter having 11 bits of lookup tables, 4 bits of filter input data and 8 bits of filter output data with the conventional transverse FIR filter. By contrast, only about 5,500 gates are required to lay out an FIR filter with the construction suggested according to the present invention, thereby reducing about 80% in number of required gates in comparison with the conventional transverse filter.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A finite impulse response filter of 1:4 interpolation with 108 taps for outputting filter output data of 8 bits with respect to filter input data of 4 bits, comprising:

four shifting and storing means of 27 bits for unifying bits of the filter input data of 4 bits, which is 2's complement, to generate bi-unified input data and shifting and storing the bi-unified input data in response to a first clock signal;

first selection means for selecting any one of the bi-unified input data stored in the four shifting and storing means of 27 bits in response to the first clock signal and a second clock signal;

address generating means for generating addresses of lookup tables corresponding to each of a plurality of filter coefficients groups in response to the bi-unified input data selected by the first selection means;

first to fourth lookup table groups for generating filter outputs of each filter coefficients group in response to the addresses generated by the address generating means;

four accumulating means for shifting the filter outputs of the filter coefficients groups respectively outputted in parallel from the first to the fourth lookup table groups;

second selection means for serially converting the outputs from each of the four accumulating means in accordance with the plurality of filter coefficients groups; and reversing means for reversing bits among the filter input data of 4 bits except the most significant bit to change the filter input data of 4 bits to an input of antipodal bits.

2. The finite impulse response filter of claim 1, wherein the address generating means comprises:

third selection means for address-changing lookup tables realized in lieu of omitted lookup tables due to a symmetry of filter coefficients to access twice; and exclusive OR means for an exclusive OR by using the most significant bit of an address inputted to access the address of the omitted lookup table due to a symmetry within the lookup tables.

3. The finite impulse response filter of claim 1, characterized in that:

each of the first to the fourth lookup tables is comprised in accordance with the filter coefficients groups;

the first and the fourth lookup table groups and the second and the third lookup table groups are accessed twice in response to a third clock signal to mutually provide lookup table values omitted due to the symmetry of coefficients; and the lookup tables in each lookup table group are generated by dividing 27 coefficients into a first lookup table having 6 coefficients, a second lookup table having 6 coefficients, and a third lookup table having 3 coefficients.

4. The finite impulse response filter of claim 3, wherein the first and the second lookup tables are accessed twice due to the symmetry of coefficients and composed of a half number of the lookup tables due to the symmetry within the lookup tables.

5. The finite impulse response filter of claim 3, wherein the third lookup table is composed of a half number of the lookup tables due to the symmetry within the lookup tables.

6. The finite impulse response filter of claim 1, wherein each of the four accumulating means comprises:

shift and sign extension means for accumulating by adding weight values to lookup table values inputted as much as the number of inputted bits in the order from the most significant bit to the least significant bit of the filter input data;

fourth selection means for selecting and outputting the lookup table values outputted from the shift and sign extension means in the order from the output value of the most significant bit to the output value of the least significant bits as much as the number of filter input bits;

adding and storing means for adding an output from the fourth selection means to a pre-stored accumulated value and so as to be stored as an accumulated value;

storing means for resetting the accumulated vale stored in the adding and storing means in the region where one of the lookup table values corresponding to the least significant bit is outputted and accumulated by the fourth selection means, and sorting a lookup table value, where corresponds to the least significant bit, added by the adding and storing means after being outputted so as to be outputted as a final output value; and fifth selection means for serially outputting the outputs from each of the four accumulating means.

7. A finite impulse response filter, comprising:

a shift register and selector for unifying bits of multi-bit filter input data to generate uni-bit input data, shift-storing the uni-bit input data in response to a plurality of clock signals, and outputting the uni-bit input data in order;

address generating means for generating addresses of lookup tables corresponding to each of a plurality of filter coefficients groups in response to outputs from the shift register and selector;

a plurality of lookup table groups for generating filter outputs of each of the plurality of filter coefficients groups in response to the addresses generated by the address generating means;

a plurality of accumulating means for shifting the filter outputs of the filter coefficients groups outputted in parallel from the lookup table groups, and accumulating the filter outputs as many as a bit number of the filter outputs;

group selection means for serially converting and outputting the outputs from each accumulating means in accordance with the filter coefficients groups, wherein the shift register and selector includes:

a plurality of reversing means for reversing bits among the multi-bit input data except the most significant bit to change the multi-bit input data to antipodal input bits;

a plurality of shift registers for shift-storing the uni-bit input data; and a multiplexer for outputting the input data stored in the plurality of shift register in order.

8. The finite impulse response filter of claim 7, wherein the address generating means comprises:

a multiplexer for accessing a realized lookup table twice in lieu of the lookup table omitted due to symmetry of the filter coefficients; and exclusive OR means for an exclusive OR by using the most significant bit of the address inputted to access the address of the lookup table omitted due to symmetry of the filter coefficients.

* * * * *